United States Patent
Yang et al.

(10) Patent No.: US 9,419,044 B2
(45) Date of Patent: *Aug. 16, 2016

(54) IMAGE SENSOR PIXEL HAVING STORAGE GATE IMPLANT WITH GRADIENT PROFILE

(71) Applicant: OMNIVISION TECHNOLOGIES, INC., Santa Clara, CA (US)

(72) Inventors: Dajiang Yang, San Jose, CA (US); Gang Chen, San Jose, CA (US); Zhenhong Fu, San Jose, CA (US); Duli Mao, Sunnyvale, CA (US); Eric A. G. Webster, Mountain View, CA (US); Sing-Chung Hu, San Jose, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 14/255,535

(22) Filed: Apr. 17, 2014

(65) Prior Publication Data

US 2015/0303235 A1    Oct. 22, 2015

(51) Int. Cl.
*H01L 27/00*    (2006.01)
*H01J 40/14*    (2006.01)
(Continued)

(52) U.S. Cl.
CPC .... *H01L 27/14643* (2013.01); *H01L 27/14612* (2013.01); *H01L 27/14614* (2013.01); *H01L 27/14689* (2013.01)

(58) Field of Classification Search
CPC ................ H01L 27/14643; H01L 27/14614; H01L 27/14806; H01L 31/18; H01L 27/14812; H01L 27/14831

USPC ................................................... 257/287–297
See application file for complete search history.

(56) References Cited

U.S. PATENT DOCUMENTS 7,557,397 B2 * 7/2009 Palsule .............. H01L 27/14601
    257/233
8,089,036 B2 * 1/2012 Manabe ................. H04N 5/353
    250/208.1

(Continued)

FOREIGN PATENT DOCUMENTS

TW    201110689 A1    3/2011

OTHER PUBLICATIONS

TW Application No. 103134663—Taiwanese Office Action and Search Report, with English Translation, issued Dec. 22, 2015 (12 pages).

*Primary Examiner* — Marcos D Pizarro Crespo
*Assistant Examiner* — Nelson Garces
(74) *Attorney, Agent, or Firm* — Blakely Sokoloff Taylor & Zafman LLP (57) ABSTRACT

A pixel cell includes a storage transistor disposed in a semiconductor substrate. The storage transistor includes a storage gate disposed over the semiconductor substrate, and a storage gate implant that is annealed and has a gradient profile in the semiconductor substrate under the storage transistor gate to store image charge accumulated by a photodiode disposed in the semiconductor substrate. A transfer transistor is disposed in the semiconductor substrate and is coupled between the photodiode and an input of the storage transistor to selectively transfer the image charge from the photodiode to the storage transistor. The transfer transistor includes a transfer gate disposed over the semiconductor substrate. An output transistor is coupled to an output of the storage transistor to selectively transfer the image charge from the storage transistor to a read out node. The output transistor includes an output gate disposed over the semiconductor substrate.

27 Claims, 4 Drawing Sheets

(51) Int. Cl.
  *H01L 27/146* (2006.01)
  *H01L 21/00* (2006.01)
  *H01L 31/18* (2006.01)
  *H01L 27/148* (2006.01)

(56) References Cited

U.S. PATENT DOCUMENTS 8,298,853 B2 * 10/2012 Adkisson .......... H01L 27/14614
                                                257/E21.001
8,835,211 B1 * 9/2014 Chen ................. H01L 27/14806
                                                257/225
8,933,494 B1 * 1/2015 Hu .................... H01L 27/14656
                                                257/223
2009/0294632 A1 * 12/2009 Rhodes ............. H01L 27/14609
                                                250/208.1
2010/0276574 A1   11/2010 Manabe
2013/0188078 A1    7/2013 Shim et al.

* cited by examiner

IMAGE SENSOR PIXEL HAVING STORAGE GATE IMPLANT WITH GRADIENT PROFILE

BACKGROUND INFORMATION

1. Field of the Disclosure

The present invention relates generally semiconductor processing. More specifically, examples of the present invention are related to semiconductor processing of image sensor pixel cell storage gates.

2. Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects the time differential between each row generates image distortion. For fast-moving objects, a rolling shutter causes a perceptible elongation distortion along the object's axis of movement.

To implement a global shutter, storage capacitors or storage transistors, which may also be referred to as storage gates herein, can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell.

Factors that affect performance in an image sensor pixel cell having a global shutter include shutter efficiency, dark current, white pixels and image lag. One tradeoff faced by designers when designing pixel cells is that as the structures of neighboring transistors (e.g., the transfer, storage transistors, and output transistors) are overlapped to reduce lag, some of the electrons become trapped in the deep implant regions between the neighboring transistors that cause "pinched" channels, which prevent some of the electrons from flowing to the output floating diffusions during transfer.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to an image sensor pixel having storage gate implant with a gradient profile are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

In typical image sensor pixel cells, most of the electrons that are trapped in pixel cells with overlapped deep implant regions are trapped between the transfer transistor and storage transistor structures due to deep storage transistor implants. Reductions in the overlap between transfer transistor and storage transistor can help to reduce the number of electrons that are trapped, but at the expense of increased photodiode to storage gate lag. Reducing storage gate implant energy could also help to reduce storage gate lag, but the risk of dark current and/or white pixels increases as a consequence. Reducing the storage gate dose could help to reduce storage gate lag, but at the expense of reduced full well capacity.

As will be shown, an imaging system with a pixel array including pixel cells having storage gate implants with gradient profiles in accordance with the teachings of the present invention enables an image sensor pixel cell array with a global shutter with reduced photodiode and storage gate transfer lag. Furthermore, as will be discussed, the risks of electrons being trapped on the transfer gate side of the pixel cell are also reduced with pixel cells having storage gate implants with gradient profiles in accordance with the teachings of the present invention.

Figure 1:
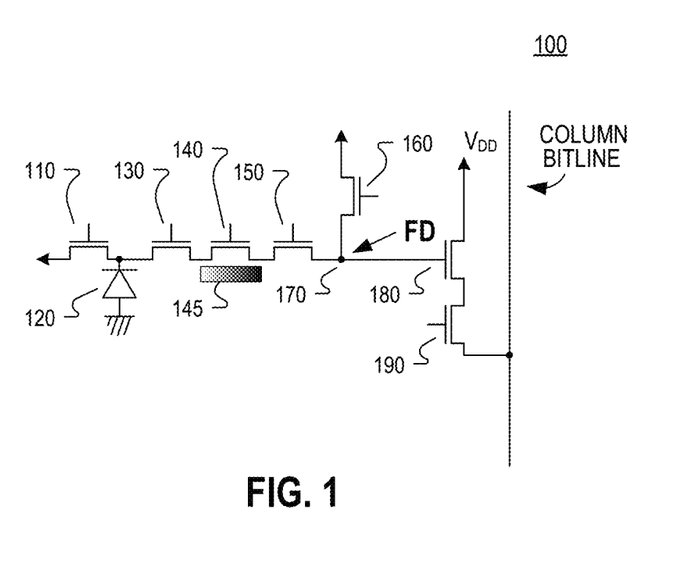
FIG. 1 is a schematic illustrating one example of a pixel cell having a storage gate implant with gradient profile in accordance with the teachings of the present invention.

To illustrate, FIG. 1 is a schematic illustrating one example of a pixel cell 100 having a storage gate implant 145 with gradient profile in accordance with the teachings of the present invention. For instance, in the depicted example, pixel cell 100 includes a global shutter transistor 110, a photodiode 120, a transfer transistor 130, a storage transistor 140, an output transistor 150, a floating diffusion 170, a reset transistor 160, an amplifier transistor 180, and a row-select transistor 190 coupled to a column bitline as shown. As illustrated in the example, the storage gate implant 145 under the gate of storage transistor 140 has a gradient doping profile in accordance with the teachings of the present invention. In particular, in one example, the effective doping level at the transfer gate side of the storage gate implant 145 is less than the effective doping level at the output gate side of the storage gate implant 145 in accordance with the teachings of the present invention. With the gradient doping profile of storage gate implant 145 as shown, a corresponding gradient potential profile is created. The resulting potential slope in storage gate implant 145 effectively pushes electrons in the storage gate towards the output gate side in accordance with the teachings of the present invention. Accordingly, the gradient profile in storage gate implant 145 reduces the storage gate electron density near the transfer gate side of storage gate implant 145 relative to the output gate side of storage gate implant 145, and reduces the storage gate transfer lag in accordance with the teachings of the present invention.

Figure 2:
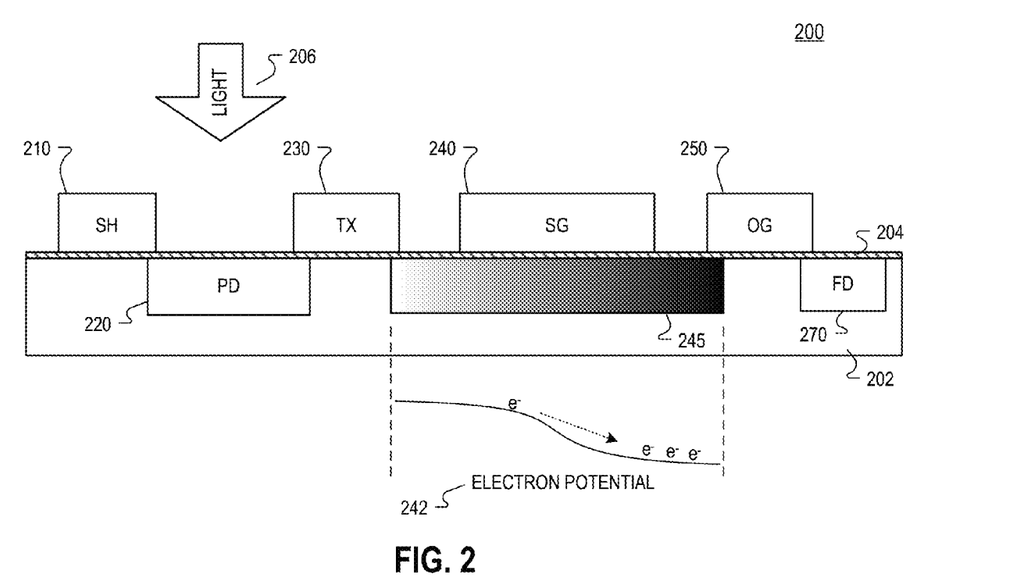
FIG. 2 is a cross-section view illustrating one example of a pixel cell having a storage gate implant with gradient profile in accordance with the teachings of the present invention.

FIG. 2 is a cross-section view illustrating one example of a pixel cell 200 having a storage gate implant 245 with gradient profile in accordance with the teachings of the present invention. It is noted that pixel cell 200 of FIG. 2 in one example is a cross-section view of pixel cell 100 of FIG. 1, and that similarly named and numbered elements referenced below are coupled and function similar to as described above. As shown in the example depicted in FIG. 2, pixel cell 200 is a front side illuminated (FSI) pixel cell that includes a photodiode 220 disposed in a semiconductor substrate 202 to accumulate image charge from light 206, which is directed thereto. In another example, it is appreciated that pixel cell 200 may alternatively be implemented as a back side illuminated (BSI) pixel cell in accordance with the teachings of the present invention. Referring back to the example illustrated in FIG. 2, the image charges accumulated in photodiode 220 are electrons. In other examples, it is appreciated that the image charges accumulated in photodiode 220 may be holes. In one example, light 206 is representative of a portion of an image directed through a lens to pixel cell 200. In one example, a global shutter transistor, including a shutter gate 210 disposed over gate oxide 204 and semiconductor substrate 202, is included in pixel cell 200, which may be utilized in order to selectively deplete (photo-voltaically generated) charges in photodiode 220. A storage transistor, including a storage gate 240 disposed over gate oxide 204 and semiconductor substrate 202, is disposed in the semiconductor substrate 202 to store the image charge. A transfer transistor, including a transfer gate 230 disposed over gate oxide 204 and semiconductor substrate 202, is disposed between the photodiode 220 and the storage transistor to selectively transfer the image charge from the photodiode 220 to the storage transistor to store the image charge accumulated by photodiode 220 in the storage transistor. An output transistor, including an output gate 250 disposed over gate oxide 204 and semiconductor substrate 202, is disposed in the semiconductor substrate 202 and coupled to an output of the storage transistor to selectively transfer the image charge from the storage transistor to a read out node, which in one example includes the floating diffusion 270 disposed in the semiconductor substrate 202. In one example, shutter gate 210, transfer gate 230, storage gate 240 and output gate 250 include polysilicon.

Continuing with the example depicted in FIG. 2, a storage gate implant 245 is implanted in semiconductor substrate 202 with a gradient profile as shown. In particular, in one example, the effective doping level at the transfer gate 230 side of the storage gate implant 245 is less than the effective doping level at the output gate 250 side of the storage gate implant 245 in accordance with the teachings of the present invention. Accordingly, with the gradient doping profile of storage gate implant 245 as shown, a corresponding gradient potential profile is created. As shown in FIG. 2, the electron potential 242 in the storage gate implant 245 decreases from the transfer gate 230 side to output gate 250 side, which creates a potential slope in storage gate implant 245 that effectively pushes electrons in the storage gate towards the output gate 250 side in accordance with the teachings of the present invention. Accordingly, the gradient profile in storage gate implant 245 reduces the storage gate electron density near the transfer gate 230 side of storage gate implant 245, and reduces the storage gate transfer lag in accordance with the teachings of the present invention.

Figure 3A:
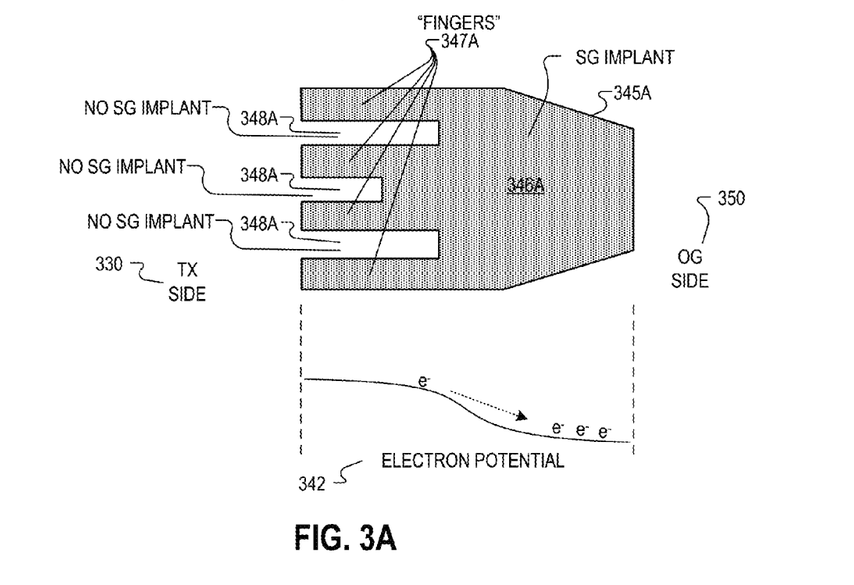
FIG. 3A is a top-down view illustrating one example of a pixel cell storage gate implant with an effective gradient profile in accordance with the teachings of the present invention.

FIG. 3A is a top-down view illustrating one example of a pixel cell storage gate implant 345A with an effective gradient profile in the semiconductor substrate under the storage gate transistor in accordance with the teachings of the present invention. It is noted that storage gate implant 345A of FIG. 3A in one example is a top-down view of storage gate implant 145 of FIG. 1, or storage gate implant 245 of FIG. 2, and that similarly named and numbered elements referenced below are coupled and function similar to as described above. As shown in the example depicted in FIG. 3A, storage gate implant 345A includes a plurality of regions 346A and 348A, with each region 346A and 348A having different effective doping concentrations that increase from the transfer gate side 330 to the output gate side 350 in accordance with the teachings of the present invention.

In the specific example depicted in FIG. 3A, in region 346A towards the output gate side 350 of the storage gate implant 345A, there is a storage gate implant of dopants into the semiconductor substrate. In one example, the dopants in storage gate implant 345A are N type dopants. However, in regions 348A towards the transfer gate side 330 of the storage gate implant 345A, dopants are not implanted, which define multiple "fingers" 347A of implanted dopants and gaps between "fingers" 347A of no implanted dopants on the transfer gate side 330 of the storage gate implant 345A in accordance with the teachings of the present invention.

In one example, after region 346A with "fingers" 347A have been implanted into the semiconductor substrate as shown, the semiconductor substrate is then annealed, which allows the some of the implanted dopants to move around in the semiconductor substrate from areas of higher doping concentration to areas of lower doping concentration. With the dopant gradient between region 346A with "fingers" 347A, which have higher doping concentrations, and regions 348A, which have lower doping concentrations, some of the implanted dopants will therefore move across the boundary between regions 346A and 348A from region 346A and "fingers" 347A into region 348A as a result of the annealing. In other words, in the example depicted in FIG. 3A, some of the implanted dopants will move from region 346A with "fingers" 347A into regions 348A, and the net result will be a dopant gradient between the OG side 350 and the TX side 330 of storage gate implant 345A in accordance with the teachings of the present invention.

In the example depicted in FIG. 3A, it is noted that the mask used to implant the dopants into region 346A is illustrated having a gap to "finger" 347A width ratios fixed at 1:1. It is appreciated that the gap to "finger" 347A width ratios may be varied, for example from 0.5:1 to 1.5:1, which allows the gradient in storage gate implant 345A to be further adjusted in accordance with the teachings of the present invention. It is appreciated that example 0.5:1 to 1.5:1 ratio is provided for explanation purposes, and that in other examples, other varied gap to "finger" 347A widths ratios may be utilized in accordance with the teachings of the present invention.

Accordingly, with the multiple "fingers" 347A of implanted dopants and no implanted dopants that are defined by regions 346A, 347A and 348A as shown in the example of FIG. 3A, and with the annealing as described, an effective gradient profile for storage gate implant 345A is provided in accordance with the teachings of the present invention. As a result, the effective doping level at the transfer gate side 330 of the storage gate implant 345A is less than the effective doping level at the output gate side 350 of the storage gate implant 345A in accordance with the teachings of the present invention. Thus, with the gradient doping profile of storage gate implant 345A as shown, a corresponding gradient potential profile is created. As shown in FIG. 3A, the electron potential 342 in the storage gate implant 345A decreases from the transfer gate side 330 to output gate side 350, which creates a potential slope in storage gate implant 345A that prevents electrons from being trapped at the transfer gate side 330 and effectively pushes electrons in the storage gate towards the output gate side 350 before being transferred to the floating diffusion in accordance with the teachings of the present invention. Accordingly, the gradient profile in storage gate implant 345A reduces the storage gate electron density near the transfer gate side 330 of storage gate implant 345A, and reduces the storage gate transfer lag in accordance with the teachings of the present invention. Furthermore, in the example depicted in FIG. 3A, it is appreciated that the gradient profile of storage gate implant 345A can be realized with only a single mask to provide region 346A with the multiple "fingers" 347A, a single implantation step, and an annealing step as discussed above in accordance with the teachings of the present invention.

Figure 3B:
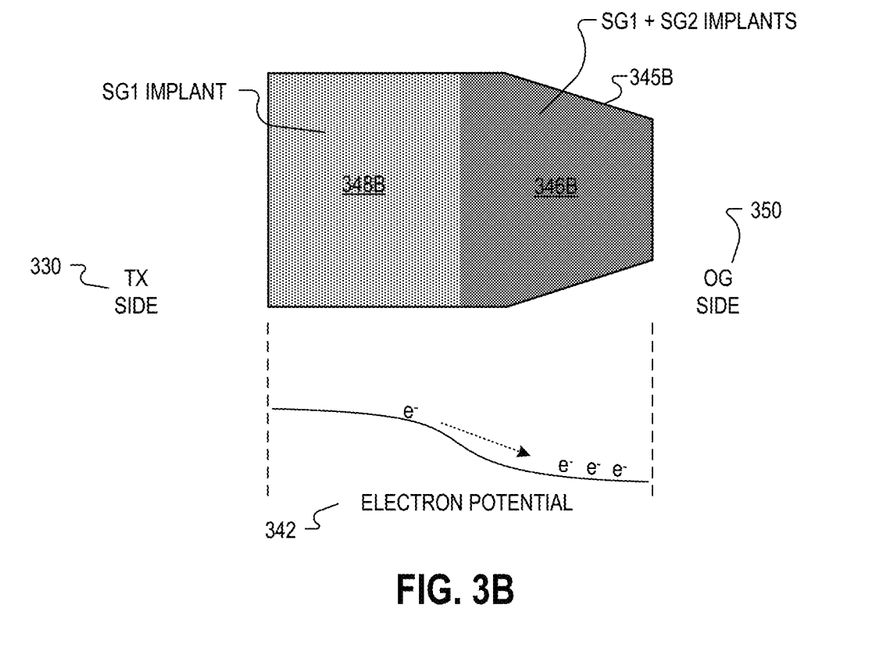
FIG. 3B is a top-down view illustrating another example of a pixel cell storage gate implant with an effective gradient profile in accordance with the teachings of the present invention.

FIG. 3B is a top-down view illustrating another example of a pixel cell storage gate implant 345B with an effective gradient profile in accordance with the teachings of the present invention. It is noted that storage gate implant 345B of FIG. 3B in one example is a top-down view of storage gate implant 145 of FIG. 1, or storage gate implant 245 of FIG. 2, and that similarly named and numbered elements referenced below are coupled and function similar to as described above. As shown in the example depicted in FIG. 3B, storage gate implant 345B includes a plurality of regions 346B and 348B, with each region 346B and 348B having different effective doping concentrations that increase from the transfer gate side 330 to the output gate side 350 in accordance with the teachings of the present invention.

In the specific example depicted in FIG. 3B, in region 348B towards the transfer gate side 330 of the storage gate implant 345B, there is a first storage gate implant of dopants, which is labeled "SG1 implant," into the semiconductor substrate. In one example, the dopants in storage gate implant 345B are N type dopants. However, in region 346B towards the output gate side 350 of the storage gate implant 345B, there is an additional second implant of dopants, which is correspondingly labeled "SG1+SG2 implants."

In one example, after regions 346B and 348B have been implanted into the semiconductor substrate as shown, the semiconductor substrate may then annealed, which allows the some of the implanted dopants to move around in the semiconductor substrate from areas of higher doping concentration to areas of lower doping concentration. With the dopant gradient between region 346B, which has a higher doping concentration, and region 348B, which has a lower doping concentration, some of the implanted dopants will therefore move across the boundary between regions 346B and 348B from region 346B into region 348B as a result of the annealing. In other words, in the example depicted in FIG. 3B, some of the implanted dopants will move from region 346B into region 348B and the net result will be a dopant gradient between the OG side 350 and the TX side 330 of storage gate implant 345B in accordance with the teachings of the present invention.

Accordingly, with an increasing number of implants of dopants into the storage gate implant 345B from the transfer gate side 330 towards the output gate side 350 as shown in the example of FIG. 3B, an effective gradient profile for storage gate implant 345B is provided in accordance with the teachings of the present invention. As a result, the effective doping level at the transfer gate side 330 of the storage gate implant 345B is less than the effective doping level at the output gate side 350 of the storage gate implant 345B in accordance with the teachings of the present invention. Thus, with the gradient doping profile of storage gate implant 345B as shown, a corresponding gradient potential profile is created. As shown in FIG. 3B, the electron potential 342 in the storage gate implant 345B decreases from the transfer gate side 330 to output gate side 350, which creates a potential slope in storage gate implant 345B that prevents electrons from being trapped at the transfer gate side 330 and effectively pushes electrons in the storage gate towards the output gate side 350 before being transferred to the floating diffusion in accordance with the teachings of the present invention. Accordingly, the gradient profile in storage gate implant 345B reduces the storage gate electron density near the transfer gate side 330 of storage gate implant 345B, and reduces the storage gate transfer lag in accordance with the teachings of the present invention.

Figure 3C:
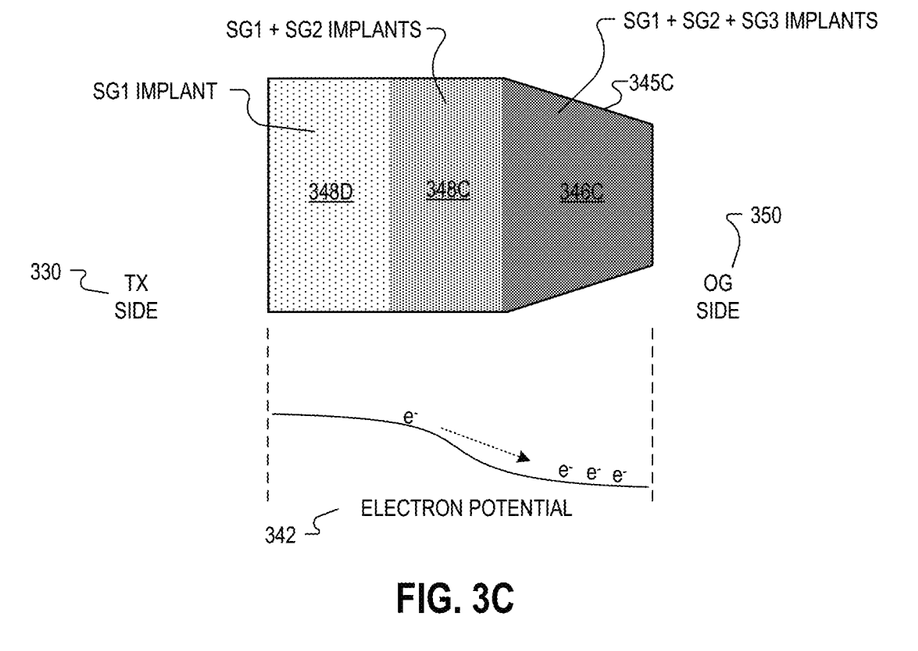
FIG. 3C is a top-down view illustrating yet another example of a pixel cell storage gate implant with an effective gradient profile in accordance with the teachings of the present invention.

FIG. 3C is a top-down view illustrating yet another example of a pixel cell storage gate implant 345C with an effective gradient profile in accordance with the teachings of the present invention. It is noted that storage gate implant 345C of FIG. 3C in one example is a top-down view of storage gate implant 145 of FIG. 1, or storage gate implant 245 of FIG. 2, and that similarly named and numbered elements referenced below are coupled and function similar to as described above. It is also appreciated that storage gate implant 345C of FIG. 3C shares many similarities with storage gate implant 345B of FIG. 3B. One difference between storage gate implant 345C of FIG. 3C and storage gate implant 345B of FIG. 3B is that storage gate implant 345C of FIG. 3C includes an additional region in, which is illustrated as a plurality of regions 346C, 348C, and 348D, with each region 346C, 348C, and 348D having different effective doping concentrations that increase from the transfer gate side 330 to the output gate side 350 in accordance with the teachings of the present invention.

In the specific example depicted in FIG. 3C, in region 348D towards the transfer gate side 330 of the storage gate implant 345C, there is a first storage gate implant of dopants, which is labeled "SG1 implant," into the semiconductor substrate. In one example, the dopants in storage gate implant 345C are N type dopants. In the example, moving towards the output gate side 350, there is another region 348C in which there is an additional storage gate implant of dopants, which is correspondingly labeled "SG1+SG2 implants." Continuing towards the output gate side 350, there is still another region 346C in which there is yet another additional storage gate implant of dopants, which is correspondingly labeled "SG1+SG2+SG3 implants."

In one example, after regions 346C, 348C and 348D have been implanted into the semiconductor substrate as shown, the semiconductor substrate is then annealed, which allows the some of the implanted dopants to move around in the semiconductor substrate from areas of higher doping concentration to areas of lower doping concentration. With the dopant gradients between region 346C, which has a higher doping concentration, region 348C, which has a lower doping concentration, and region 348D, which has an even lower doping concentration than region 348C, some of the implanted dopants will therefore move across the boundaries between regions 346C and 348C, and 348C and 348D, from region 346C into region 348C, and from region 348C into 348D, as a result of the annealing. In other words, in the example depicted in FIG. 3C, some of the implanted dopants will move from region 346C into region 348C, and from 348C into region 348D, and the net result will be a dopant gradient between the OG side 350 and the TX side 330 of storage gate implant 345C in accordance with the teachings of the present invention.

Accordingly, with an increasing number of implants of dopants into the storage gate implant 345C from the transfer gate side 330 towards the output gate side 350 as shown in the example of FIG. 3C, an effective gradient profile for storage gate implant 345C is provided in accordance with the teachings of the present invention. As a result, the effective doping level at the transfer gate side 330 of the storage gate implant 345C is less than the effective doping level at the output gate side 350 of the storage gate implant 345C in accordance with the teachings of the present invention. Thus, with the gradient doping profile of storage gate implant 345C as shown, a corresponding gradient potential profile is created. As shown in FIG. 3C, the electron potential 342 in the storage gate implant 345C decreases from the transfer gate side 330 to output gate side 350, which creates a potential slope in storage gate implant 345C that prevents electrons from being trapped at the transfer gate side 330 and effectively pushes electrons in the storage gate towards the output gate side 350 before being transferred to the floating diffusion in accordance with the teachings of the present invention. Accordingly, the gradient profile in storage gate implant 345C reduces the storage gate electron density near the transfer gate side 330 of storage gate implant 345C, and reduces the storage gate transfer lag in accordance with the teachings of the present invention.

Figure 4:
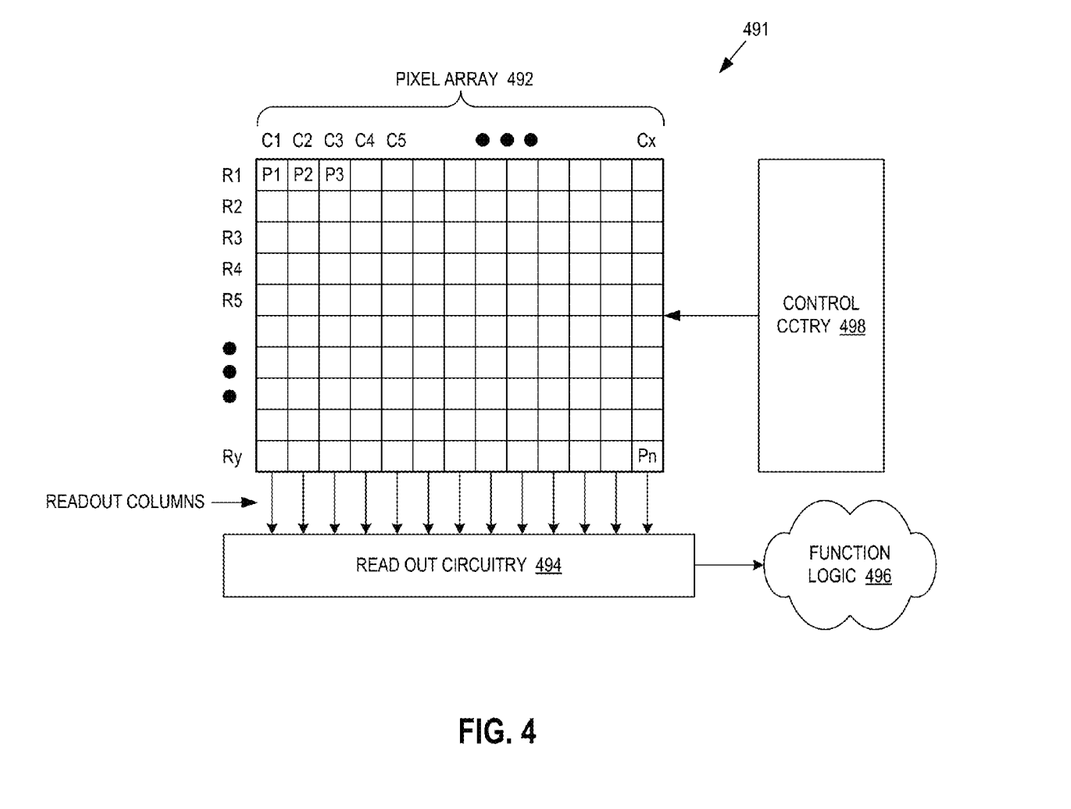
FIG. 4 is a diagram illustrating one example of an imaging system with a pixel array including pixel cells having storage gate implants with gradient profiles in accordance with the teachings of the present invention.

FIG. 4 is a diagram illustrating one example of an imaging system 491 including a pixel array having pixel cells including storage gate implants with gradient profiles in accordance with the teachings of the present invention. As shown in the depicted example, imaging system 491 includes pixel array 492 coupled to control circuitry 498 and read out circuitry 494, which is coupled to function logic 496.

In one example, pixel array 492 is a two-dimensional (2D) array of image sensor pixel cells (e.g., pixels P1, P2, P3, ..., Pn). It is noted that the pixel cells P1, P2, ... Pn in the pixel array 492 may be examples of pixel cell 100 of FIG. 1 and/or of pixel cell 200 of FIG. 2, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell P1, P2, P3, ..., Pn has acquired its image data or image charge, the image data is read out by read out circuitry 494 and then transferred to function logic 496. In various examples, read out circuitry 494 may include amplification circuitry, analog-to-digital (ADC) conversion circuitry, or otherwise. Function logic 496 may simply store the image data or even manipulate the image data by applying post image effects (e.g., crop, rotate, remove red eye, adjust brightness, adjust contrast, or otherwise). In one example, read out circuitry 494 may read out a row of image data at a time along read out column lines (illustrated) or may read out the image data using a variety of other techniques (not illustrated), such as a serial read out or a full parallel readout of all pixels simultaneously.

In one example, control circuitry 498 is coupled to pixel array 492 to control operational characteristics of pixel array 492. In one example, control circuitry 498 is coupled to generate a global shutter signal for controlling image acquisition for each pixel cell. In the example, the global shutter signal simultaneously enables all pixels cells P1, P2, P3, ... Pn within pixel array 492 to simultaneously enable all of the pixel cells in pixel array 492 to simultaneously transfer the image charge from each respective photodiode during a single acquisition window.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
    a storage transistor disposed in a semiconductor substrate, the storage transistor including a storage gate disposed over the semiconductor substrate, and a storage gate implant that is annealed and has a gradient profile in the semiconductor substrate under the storage transistor gate to store image charge accumulated by a photodiode disposed in the semiconductor substrate;
    a transfer transistor disposed in the semiconductor substrate and coupled between the photodiode and an input of the storage transistor to selectively transfer the image charge from the photodiode to the storage transistor, the transfer transistor including a transfer gate disposed over the semiconductor substrate; and an output transistor disposed in the semiconductor substrate and coupled to an output of the storage transistor to selectively transfer the image charge from the storage transistor to a read out node, the output transistor including an output gate disposed over the semiconductor substrate.

2. The pixel cell of claim 1 wherein the storage gate implant has multiple fingers defined on a transfer gate side of the storage gate implant with gaps defined between the multiple fingers.

3. The pixel cell of claim 2 wherein a ratio of a width of the gaps and a width of the multiple fingers is varied.

4. The pixel cell of claim 2 wherein a ratio of a width of the gaps and a width of the multiple fingers is fixed.

5. The pixel cell of claim 1 wherein the storage gate implant has a gradient dopant profile such that a doping concentration of the storage gate implant on a transfer gate side of the storage gate implant is less than the doping concentration of the storage gate implant on an output gate side of the storage gate implant.

6. The pixel cell of claim 1 wherein the storage gate implant has a gradient potential profile such that a potential slope in the storage gate implant pushes electrons in the storage gate implant towards an output gate side of the storage gate implant.

7. The pixel cell of claim 1 wherein the storage gate implant has a reduced storage gate electron density near a transfer gate side of the storage gate implant relative to an output gate side of the storage gate implant.

8. The pixel cell of claim 1 wherein the storage gate implant comprises a plurality of regions, wherein each one of the plurality of regions of the storage gate implant has a different doping concentration, wherein the doping concentration of each one of the plurality of regions of the storage gate implant increases from a transfer gate side of the storage gate implant to an output gate side of the storage gate implant.

9. The pixel cell of claim 1 wherein the transfer gate, the storage gate and the output gate comprise polysilicon.

10. The pixel cell of claim 1 further comprising a gate oxide disposed between the semiconductor substrate and the transfer gate, the storage gate, and the output gate.

11. The pixel cell of claim 1 wherein the readout node comprises a floating diffusion disposed in the semiconductor substrate.

12. The pixel cell of claim 1 wherein the image charge comprises electrons.

13. The pixel cell of claim 1 wherein the storage gate implant comprises N-type dopants.

14. The pixel cell of claim 1 further comprising:
a reset transistor disposed in the semiconductor substrate and coupled to the read out node;
an amplifier transistor disposed in the semiconductor substrate having an amplifier gate coupled to the readout node; and
a row select transistor disposed in the semiconductor substrate coupled between a bitline and the amplifier transistor.

15. The pixel cell of claim 1 further comprising a shutter gate transistor disposed in the semiconductor substrate and coupled to the photodiode to selectively deplete the image charge from the photodiode.

16. An imaging system, comprising:
a pixel array of pixel cells, wherein each one of the pixel cells includes:
a storage transistor disposed in a semiconductor substrate, the storage transistor including a storage gate disposed over the semiconductor substrate, and a storage gate implant that is annealed and has a gradient profile in the semiconductor substrate under the storage transistor gate to store image charge accumulated by a photodiode disposed in the semiconductor substrate;
a transfer transistor disposed in the semiconductor substrate and coupled between the photodiode and an input of the storage transistor to selectively transfer the image charge from the photodiode to the storage transistor, the transfer transistor including a transfer gate disposed over the semiconductor substrate; and
an output transistor disposed in the semiconductor substrate and coupled to an output of the storage transistor to selectively transfer the image charge from the storage transistor to a read out node, the output transistor including an output gate disposed over the semiconductor substrate;
control circuitry coupled to the pixel array to control operation of the pixel array; and
read out circuitry coupled to the pixel array to readout image data from the plurality of pixels.

17. The imaging system of claim 16 wherein the control circuitry is coupled to selectively send a global shutter signal to the pixel array to simultaneously enable all of the pixel cells in pixel array to simultaneously transfer the image charge from each respective photodiode during a single acquisition window.

18. The imaging system of claim 16 wherein the storage gate implant has multiple fingers defined on a transfer gate side of the storage gate implant with gaps defined between the multiple fingers.

19. The imaging system of claim 18 wherein a ratio of a width of the gaps and a width of the multiple fingers is varied.

20. The imaging system of claim 18 wherein a ratio of a width of the gaps and a width of the multiple fingers is fixed.

21. The imaging system of claim 16 wherein the storage gate implant has a gradient dopant profile such that a doping concentration of the storage gate implant on a transfer gate side of the storage gate implant is less than the doping concentration of the storage gate implant on an output gate side of the storage gate implant.

22. The imaging system of claim 16 wherein the storage gate implant has a gradient potential profile such that a potential slope in the storage gate implant pushes electrons in the storage gate implant towards an output gate side of the storage gate implant.

23. The imaging system of claim 16 wherein the storage gate implant has a reduced storage gate electron density near a transfer gate side of the storage gate implant relative to an output gate side of the storage gate implant.

24. The imaging system of claim 16 wherein the storage gate implant comprises a plurality of regions, wherein each one of the plurality of regions of the storage gate implant has a different doping concentration, wherein the doping concentration of each one of the plurality of regions of the storage gate implant increases from a transfer gate side of the storage gate implant to an output gate side of the storage gate implant.

25. The imaging system of claim 16 wherein the read out node comprises a floating diffusion disposed in the semiconductor substrate.

26. The imaging system of claim 16 wherein each one of the pixel cells further comprises:
a reset transistor disposed in the semiconductor substrate and coupled to the read out node;
an amplifier transistor disposed in the semiconductor substrate having an amplifier gate coupled to the read out node; and a row select transistor disposed in the semiconductor substrate coupled between a bitline and the amplifier transistor.

27. The imaging system of claim 16 wherein each one of the pixel cells further comprises a shutter gate transistor disposed in the semiconductor substrate and coupled to the photodiode to selectively deplete the image charge from the photodiode.

* * * * *